(12) United States Patent
Stephens et al.

(10) Patent No.: US 6,304,609 B1
(45) Date of Patent: *Oct. 16, 2001

(54) COMMUNICATION SYSTEM FOR BROADCASTING TO MOBILE USERS

(75) Inventors: Scott A. Stephens; Terrence R. Smigla, both of Manhattan Beach; Donald R. Martin, Redondo Beach, all of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/282,362

(22) Filed: Mar. 31, 1999

Related U.S. Application Data (62) Division of application No. 08/864,774, filed on May 29, 1997.

(51) Int. Cl.[7] .................................................. H04L 27/00
(52) U.S. Cl. ........................ 375/259; 375/285; 375/295; 375/296
(58) Field of Search ..................................... 375/224, 225, 375/227, 267, 259, 285, 295, 296

(56) References Cited

U.S. PATENT DOCUMENTS

| | | | |
|---|---|---|---|
| 5,241,563 | * 8/1993 | Paik et al. ................................. | 375/1 |
| 5,263,051 | * 11/1993 | Eyuboglu ................................ | 375/34 |
| 5,483,541 | * 1/1996 | Linsky ................................... | 371/2.1 |
| 5,592,471 | 1/1997 | Briskman . | |
| 5,636,242 | * 6/1997 | Tsujimoto ............................ | 375/200 |
| 5,719,875 | * 2/1998 | Wei ....................................... | 371/2.1 |
| 5,960,039 | * 9/1999 | Martin et al. ......................... | 375/267 |
| 5,982,813 | * 11/1999 | Dutta et al. ........................... | 375/219 |
| 6,009,124 | * 12/1999 | Smith et al. .......................... | 375/267 |
| 6,055,277 | * 4/2000 | Stephens et al. ..................... | 375/285 |
| 6,088,387 | * 7/2000 | Gelblum et al. ..................... | 375/222 |
| 6,151,690 | * 11/2000 | Peeters ................................. | 714/701 |

OTHER PUBLICATIONS

Overview of Techniques for Mitigation of Fading and Shadowing in the Direct Broadcast Satellite Radio Environment, David Bell, John Gevargiz, Arvydas Vaisnys and David Julian.

* cited by examiner

*Primary Examiner*—Stephen Chin
*Assistant Examiner*—Dac V. Ha
(74) *Attorney, Agent, or Firm*—Harness, Dickey & Pierce (57) ABSTRACT

A communication system (10) implemented to be specifically matched to the time and spatially dependent statistics of a transmission channel (36). The communication system (10) is used for broadcasting over the channel (36) to users in a coverage region (18). The communication system (10) includes a transmitter (12) having an error correction encoder (30) and a weighted interleaver (32). The error correction encoder (30) includes a first input to receive data bits and a first output. The error correction encoder (30) expands each data bit received at said input by an encoder rate. The weighted interleaver (32) includes a second input to receive the expanded data bits and a second output. The weighted interleaver (32) has a non-uniform delay distribution between a minimum delay and a maximum delay to interleave the expanded data bits by the non-uniform delay distribution. The communication system (10) also employs a weighted link margin matched to the time and spatially dependent statistics of the transmission channel.

13 Claims, 6 Drawing Sheets

APPROXIMATING AN ARBITRARY DELAY FUNCTION WITH UNIFORM DELAY BLOCKS

COMMUNICATION SYSTEM FOR BROADCASTING TO MOBILE USERS

This application is a divisional of U.S. patent application Ser. No.: 08/864,774 filing date May 29, 1997.

BACKGROUND OF THE INVENTION

1. Field of the Invention

This invention relates generally to a communication system and, more particularly, to a communication system for broadcasting to mobile users.

2. Discussion of the Related Art

For communication systems in which information is broadcast to mobile users, a key challenge in such systems is overcoming signal degradation effects associated with mobile propagation. The mobile user is subject to a time-varying environment that includes attenuation from physical blockages (i.e., buildings, trees, terrain, etc.), as well as multipath and interference effects. One way of overcoming these effects is to increase the transmit power beyond what is required for clear-line-of-sight (CLOS) operation in a multipath-free and interference-free environment. However, due to the large amount of additional transmit power often required, this is not always feasible for practical communication systems. This is particularly relevant for satellite-based communication systems broadcasting to mobile users. Although, there is generally less blockage for satellite-based systems than terrestrial-based systems due to the higher elevation angles, it is still difficult in a satellite-based system to transmit enough power to overcome the signal attenuation effects, particularly in outer fringe areas of the coverage region.

Communication systems are also increasingly expected to be capacity efficient and heavy demands are currently required on many different types of digital communication channels. With many of these communication channels, a relatively large amount of bit errors may occur because of the noted physical blockage in a relatively short period of time within a sequence of transmitted bits. Errors occurring in this manner are generally referred to as burst errors, and thus, such communication channels, particularly mobile communications channels, are typically referred to as bursty or fading channels.

Consequently, communication systems operating in the mobile propagation environment have both time and spacial dependencies. Conventional communication systems may thus employ coding and interleaving, as well as clear-line-of-sight link margins to combat the time and spatially vary mobile propagation environment. Although such techniques may be somewhat effective in this environment, current implementations are not very efficient in terms of the way they utilize the available power, bandwidth and receiver resources, such as receiver memory.

Traditional coding methods for communication systems operating through a bursty or fading channel often employ some form of interleaving in order to make the communication system more reliable. As is known in the art, interleaving attempts to spread the effect of burst errors in time such that the bit errors are decorrelated and separated from one another. This repositioning of error bits tends to separate the error bits so that they can be processed in conjunction with an encoding and decoding communication system. A convolutional or block decoder is able to tolerate up to some fraction of its input bits degraded or erased, known as the decoder's erasure threshold, and still provide acceptable performance, measured by bit error probability. The purpose of the conventional interleaver is thus to reduce the probability that the decoder's erasure threshold is exceeded.

Conventional uniform interleavers have an input-to-output delay distribution that is uniform in probability over an interval from a minimum delay to a maximum delay or length of the interleaver. When optimizing the performance of a conventional uniform interleaver, the only major trade involving the interleaver is its delay or length. If the interleaver is much longer than the correlation time of the channel, which is generally defined as the separation time at which fading probabilities become uncorrelated, the probability of a burst error at the output of the interleaver is small. The maximum delay or length of the interleaver is thus generally related to the fade correlation time of the channel. Although a uniform interleaver is not necessarily optimized for a particular channel, it is generally effective when the maximum delay or length is chosen to be much larger than the fade correlation time of the channel.

The coding parameters are also generally chosen based on the assumption that the interleaver/deinterleaver has managed to completely decorrelate fading events over time. In reality however, the length of a uniform interleaver necessary to sufficiently decorrelate common mobile fading channels becomes unreasonably long. This puts excessive memory requirements on the receiver and has the additional disadvantage that it slows down the acquisition process. As the fade correlation time becomes even longer, it is generally not feasible to make a uniform interleaver of sufficient delay or length to provide adequate decorrelation of the faded information. With longer delays or interleaver length, a delay in data acquisition becomes even longer. Such an information delay degrades the quality of real time signals, especially in two-way mobile voice communications. Consequently, long uniform interleavers are not well-suited to mobile communication systems that require fast acquisition. Moreover, simple retransmission of data as is used in some existing systems is an inefficient means for dealing with burst errors in the channel.

As far as the link margin is concerned, some conventional systems use link margin as their primary means of fade mitigation. This-may be conceptually effective, but is an extremely inefficient use of transmit power resources and in fact many systems cannot afford to provide this much excess transmit power. Even if link margin is coupled with coding/ interleaving, often the system is designed for a single minimum link margin over the coverage region. It is typically based on the worst case propagation statistics over the coverage region. The actual link margin will just be whatever results from standard transmit and receiver antenna gain patterns used to cover the region with the minimum link margin. There is no effort to match the link margin to the geographically varying propagation environment, so often this results in excessive link margins in the areas that don't need it, and having just enough in areas that need it the most. In the end, such use is an inefficient means of allocating available power.

What is needed then is a communication system for broadcasting to mobile users having a structure of coding/ interleaving and link margins designed specifically to match the time and spatial dependencies of the propagation environment such that it will not suffer from the above mentioned disadvantages. This will, in turn, result in superior performance in the mobile environment with efficient use of power, bandwidth and receiver resources; minimize expected correlation between deinterleaver output bits; increase data acquisition times; increase quality of real time signals; decrease the probability that the average erasure fraction exceeds the decoder's threshold; remove the restriction of a uniform interleaver delay; matches the length and shape of the interleaver, as well as the rate of the encoder to channel correlation statistics; provides an overall communication system specifically designed for the signal propagation characteristics of mobile users; minimizes outages in a power efficient manner; provides reliable communication to mobile users; and intentionally weights system link margins across the coverage region where the mobile users operate to counteract regional variations in the propagation environment. It is, therefore, an object of the present invention to provide such a communication system for broadcasting to mobile users.

SUMMARY OF THE INVENTION

In accordance with the teachings of the present invention, a communication system for broadcasting to mobile users in a coverage region is disclosed. The communication system utilizes an error correction encoder and a weighted interleaver, as well as a link margin structure which are designed to be specifically matched to the time and spatially dependent channel fade statistics to provide optimum performance. This is basically achieved by determining a channel correlation function in time for the transmit channel and determining a non-uniform interleaver delay distribution based upon this channel correlation function, as well as determining an optimum encoder rate and a link margin structure.

In one preferred embodiment, a communication system for broadcasting over a channel to users in a coverage region includes a transmitter. The transmitter includes an error correction encoder and a weighted interleaver. The error correction encoder includes a first input to receive data bits and a first output. The error correction encoder expands each data bit received at the input by an encoder rate. The weighted interleaver has a second input to receive the expanded data bits and a second output. The weighted interleaver utilizes a non-uniform delay distribution between a minimum delay and a maximum delay to interleave the expanded data bits by the non-uniform delay distribution.

Use of the present invention provides a communication system for broadcasting over a channel to users in a coverage region. As a result, the aforementioned disadvantages associated with the current communication systems have been substantially reduced or eliminated.

BRIEF DESCRIPTION OF THE DRAWINGS

Still other advantages of the present invention will become apparent to those skilled in the art after reading the following specification and by reference to the drawings in which.

DETAILED DESCRIPTION OF THE PREFERRED EMBODIMENT(S)

The following description of the preferred embodiments concerning a communication system for broadcasting to mobile users is merely exemplary in nature and is in no way intended to limit the invention or its application or uses. Moreover, while the invention is discussed in detail below with mobile users, one skilled in the art will recognize that the communication system can be used by other users as well.

Figure 1:
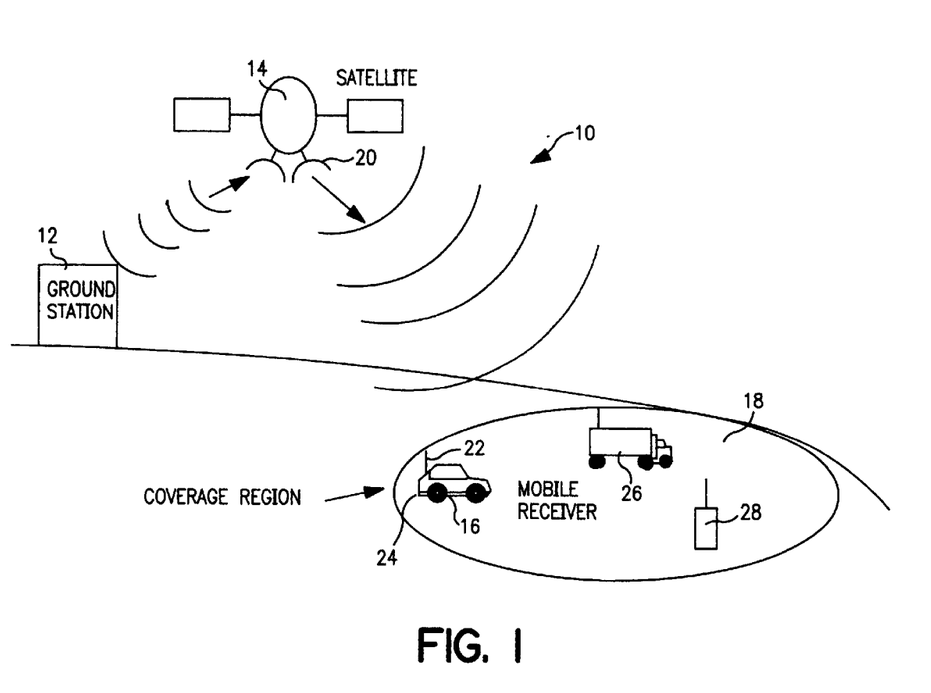
FIG. 1 is an overall communication system block to diagram of the present invention.

Referring to FIG. 1, a communication system 10 for broadcasting to mobile users in a system environment is shown. The communication system 10 includes a ground station 12, a repeater satellite 14 and a mobile receiver 16 within a coverage area 18. The ground station 12 transmits data or communication signals, such as audio, up to the repeater satellite 14. The repeater satellite 14 retransmits or broadcasts the communication signals from the ground station 12 into the coverage area 18, via an antenna 20. The mobile receiver 16 operating within the coverage area 18 receives this communication signal, via an antenna 22. The antenna 20 and antenna 22 utilize a weighted link margin technique, further discussed herein, to match the link margin to the geographically varying propagation environment. The mobile receiver 16 may be located in various regions throughout the coverage area 18 such as in an automobile 24, a truck 26 or a hand-held unit 28.

Figure 2:
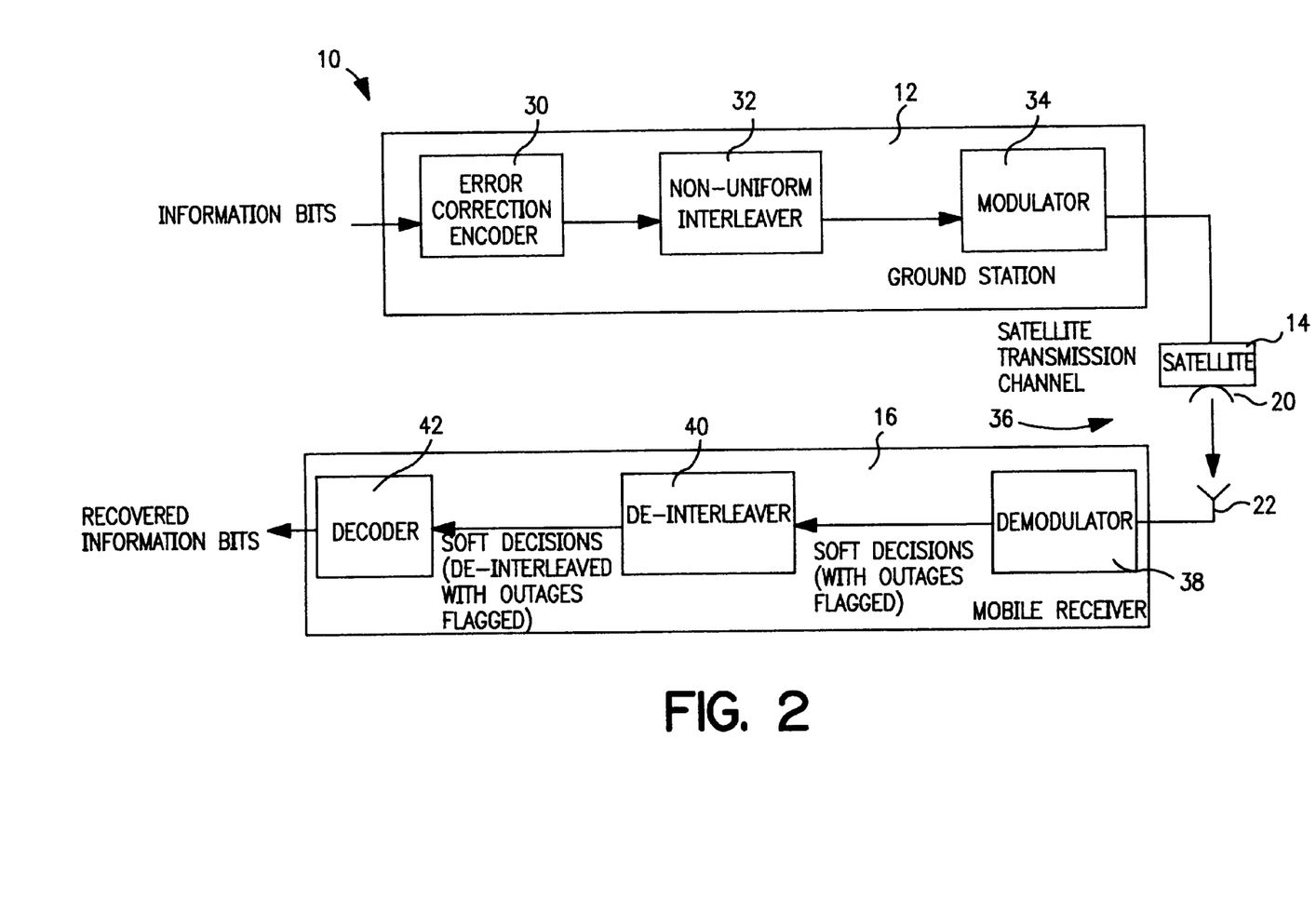
FIG. 2 is a detailed schematic block diagram of a first preferred embodiment of the present invention.

Referring to FIG. 2, a detailed schematic block diagram of the communication system 10 according to a first preferred embodiment of the present invention is shown. The schematic block diagram details the ground station or transmitter 12 in communication with the satellite 14 which retransmits communication signals, via antenna 20, to the mobile receiver 16 which receives the information, via antenna 22. The ground station or transmitter 12 includes an error correction encoder 30, a weighted or non-uniform interleaver 32 and a modulator 34 which transfers the communication signals, via a satellite transmission channel or link 36 to the mobile receiver 16. The mobile receiver 16 includes a demodulator 38, a weighted deinterleaver 40 and a decoder 42.

Digital information or data bits, typically audio data in the mobile communication system 10, are applied to the error correction encoder 30. The error correction encoder 30 is a conventional error correction encoder 30 which uses error correction coding to expand the data bits being sent through the encoder 30 by an encoder rate. In other words, should a one-quarter rate encoder 30 be selected, each bit through the encoder 30 will be expanded to four redundant or code bits. The expanded data bits are then applied to the weighted interleaver 32.

The weighted interleaver 32 randomly or non-uniformly distributes the expanded data bits in time between a minimum delay and a maximum delay to provide optimum decorrelation with regard to the fading statistics of channel 36. In other words, the interleaver 32 will route the expanded data bits pseudo-randomly according to a non-uniform probability distribution from a minimum delay to a maximum delay. The weighted interleaver 32 and the weighted deinterleaver 40 are discussed in detail in U.S. Pat. No. 5,852,614 entitled "WEIGHTED INTERLEAVING FOR CORRELATED CHANNEL CODING", naming as inventors Scott Adam Stephens, Terrence Raymond Smigla, and Donald Ray Martin, filed concurrently herewith, which is hereby incorporated by reference and further discussed herein. The parameters of the encoder 30 and the weighted interleaver 32 are both chosen in a complimentary fashion to be matched to the fade statistics of the channel 36. Thus, the encoder 30 provides the error correction capabilities and the interleaver 32 and deinterleaver 40 decorrelate the fade statistics that decoder 42 must handle. The error correction encoder 30 is selected to provide enough error correction capability that the decoder 42 can successfully tolerate the fade statistics of channel 36, as seen at the output of the weighted deinterleaver 40.

The combination of the conventional error correction encoder 30 with the weighted or non-uniform interleaver 32 are thus selected such that the encoding rate and the non-uniform interleaver delay distribution $\rho(\tau)$ are uniquely matched to the statistics of the channel 36 to yield superior performance. By determining the-channel correlation function R of the channel 36, the length and shape of the weighted non-uniform interleaver 32 can be determined to minimize the expected fade correlation out of the deinterleaver 40. The coding parameters are then chosen so that they can sufficiently correct the error distribution that results from the channel fading statistics being processed by the deinterleaver 40. Furthermore, it is preferable to match the encoder 30 with the interleaver 32 so that there is an alignment of paths. Specifically, if the encoder rate selected is ¼, each bit in will generate four (4) redundant or code bits out. Thus, it would be desirable for the interleaver 32 to have four (4) internal paths or branches, further discussed herein.

The expanded and interleaved data bits from the weighted interleaver 32 are then applied to the modulator 34. The modulator 34 is a conventional modulator using a common technique such as PSK, FSK, QAM, etc. If the system supports multiple channels, the channelization could be performed using TDM, CDM, FDM, etc. The modulator 34 takes the digital data bits and modulates the data bits onto a carrier signal in the particular signal format selected. From the modulator 34, the ground station or transmitter 12 transmits the resultant RF communication signals to the repeater satellite 14.

The satellite 14 re-transmits or broadcasts the communication signals from the antenna 20 into the coverage region 18. Since the performance in the mobile environment is highly dependent on the local geographic features, it is much more difficult to achieve good mobile communication links 36 in areas with many tall buildings or trees than it is in flat, open areas. Moreover, in satellite-to-mobile links there is far less blockage in regions where the elevation angles to the satellite is high, such as that shown with regard to the automobile 24 versus a shallower angle as shown with the hand-held receiver 28. For example, at a first specifically dependent location or area in the coverage region 18, the elevation angle to the satellite may be high, creating less of a chance for blockage or fading versus a second location or position in the coverage region 18 having a more shallower elevation angle, creating more of a chance for blockage or fades. Moreover, outer fringe areas of coverage region 18 would also typically have a lower signal-to-noise ratio (SNR) due to the power roll-off in these areas.

As a means for compensating for these effects, the communication system 10 utilizes a unique method to make efficient and effective use of available transmit power by intentionally weighting link margins across the coverage area 18 to equalize and maximize the performance for all users within the coverage area 18. This is essentially accomplished by shaping the transmit and receive antenna patterns to correspond to geography-dependent or time and spatially dependent propagation effects. In the satellite-to-mobile communication system 10, the transmit antenna 20 of the satellite 14 may be shaped to provide higher gains to regions with low elevation angles, urban areas, mountainous areas, etc. Similarly, the mobile antenna 22 may have higher gains at low elevation angles or the gain may be specifically maximized for the range of elevation angles under which it is likely to operate. In other words, the link margins for various locations throughout the coverage region 18 will be adjusted by the antenna gains so that throughout the coverage region 18, the quality or performance of the receiver 16 measured by a performance metric will be substantially the same.

For example, the mobile receiver 16 will require a certain signal-to-noise ratio (SNR) in dBs in order to meet a target bit error rate (BER) or performance metric under clear-line-of-sight (CLOS) conditions. If the coverage region 18 is divided into many separate areas forming the total coverage region 18 and the SNR and BER of the receiver 16 is monitored in each region, the SNR in dBs or the link margin will generally be required to be different in each region in order to achieve substantially similar performance of the receiver 16 throughout the coverage region 18, where performance is defined as a percent of time BER is better than a target BER. Thus, the link margins can be considered to be the excess or additional SNR required beyond that necessary to meet the target BER under CLOS conditions. This excess CLOS link margin provides some means of combating the non-ideal factors of the propagation environment which are geographically dependent. The link margins throughout the coverage region 18 are thus intentionally weighted to yield similar performance of the receiver 16 throughout the region 18. A detailed description of the method or steps for compensating for these effects are further discussed herein.

The broadcasted communication signals are received by the antenna 22 in the mobile receiver 16 and applied to the demodulator 38. Demodulator 38 is any conventional demodulator appropriate for the signal format utilized. The demodulator 38 strips or removes the carrier signal and converts the RF communication signal back to digital data bits which at this point are in the form of soft decisions. Periods of fades (i.e. signal power loss) are also detected by configuring the demodulator 38 to measure received power level, received signal-to-noise ratio (SNR), tracking loop statistics, etc. Since the demodulator 38 detects the periods of fade, the demodulator 38 may null (i.e. force to zero or ground) the signal during the fade period because the signal will generally be noise. Alternatively, the demodulator 38 may flag the data bits transferred during the fading period by transferring soft decisions from the demodulator 38 along with an outage marker. In other words, the soft decisions are organized or arranged in packets or words with a flag inside the packet or word to indicate that the received signal during that time should be ignored. The flags are later read by the decoder 42 so that the decoder 42 knows to ignore the soft decisions or to null the soft decisions if a viterbi decoder 42 is utilized.

The weighted deinterleaver 40 operates complimentary to the weighted interleaver 32 to unshuffle the data bit stream, thereby transferring the data bits in a substantially similar data bit stream that was received by the weighted interleaver 32. Moreover, since the flagged soft decisions are transferred in packets or words, the header information stays time aligned with the soft decisions in each packet and is not lost or shuffled as the data bits or soft decisions pass through the weighted deinterleaver 40. From the weighted deinterleaver 40, the deinterleaved expanded data bits or soft decision stream is applied to the decoder 42 which decodes the deinterleaver soft decision stream to recover substantially the same information or data bits that were applied to the error correction encoder 30.

Figure 3:
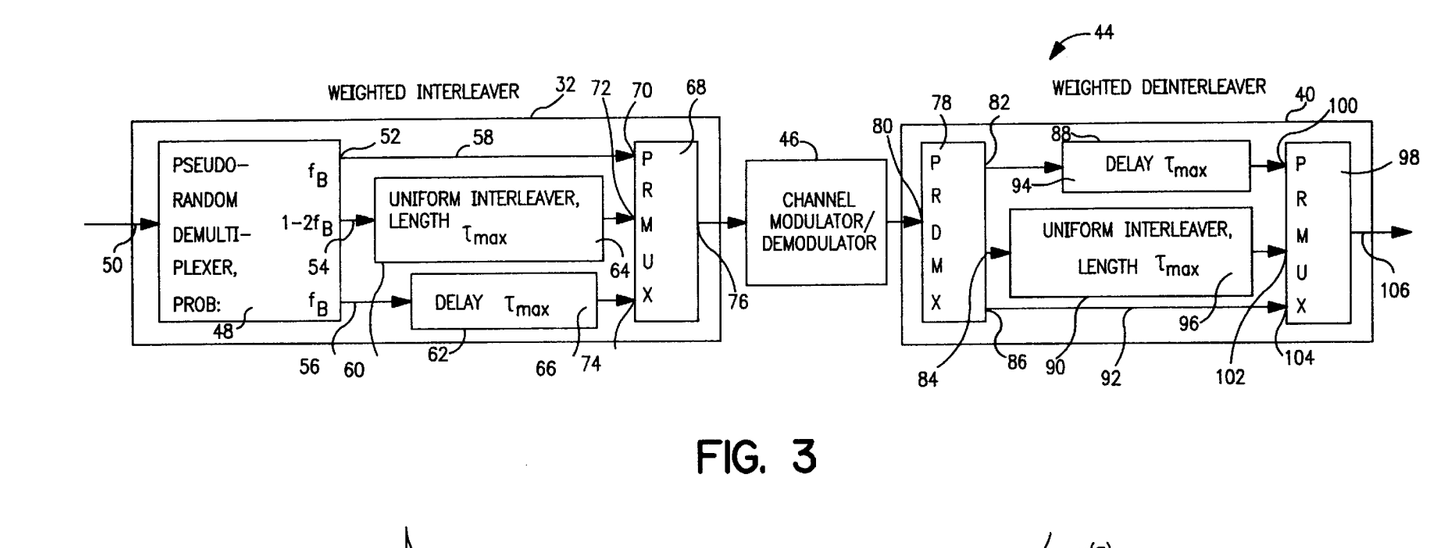
FIG. 3 is a detailed schematic block diagram of the interleaver/deinterleaver shown in FIG. 2.
Figure 4:
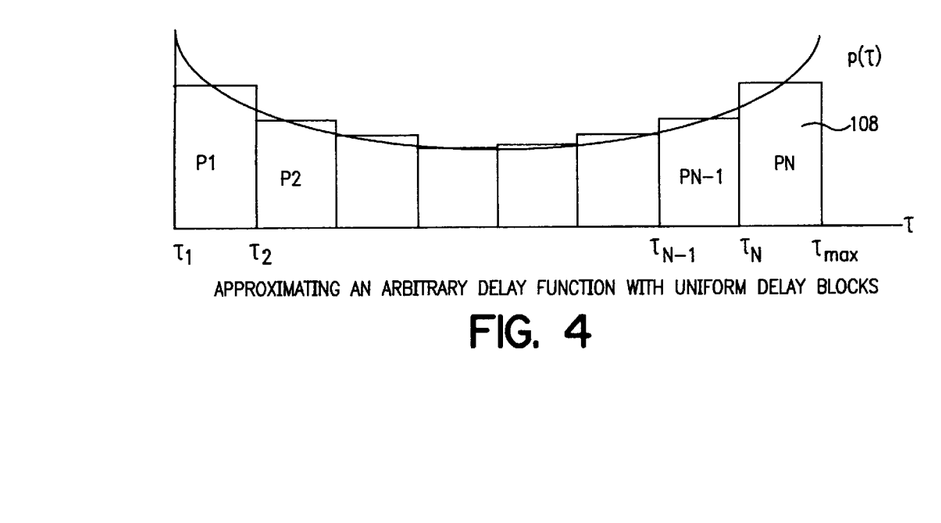
FIG. 4 is a graph representing an interleaver delay distribution function $\rho(\tau)$.
Figure 5:
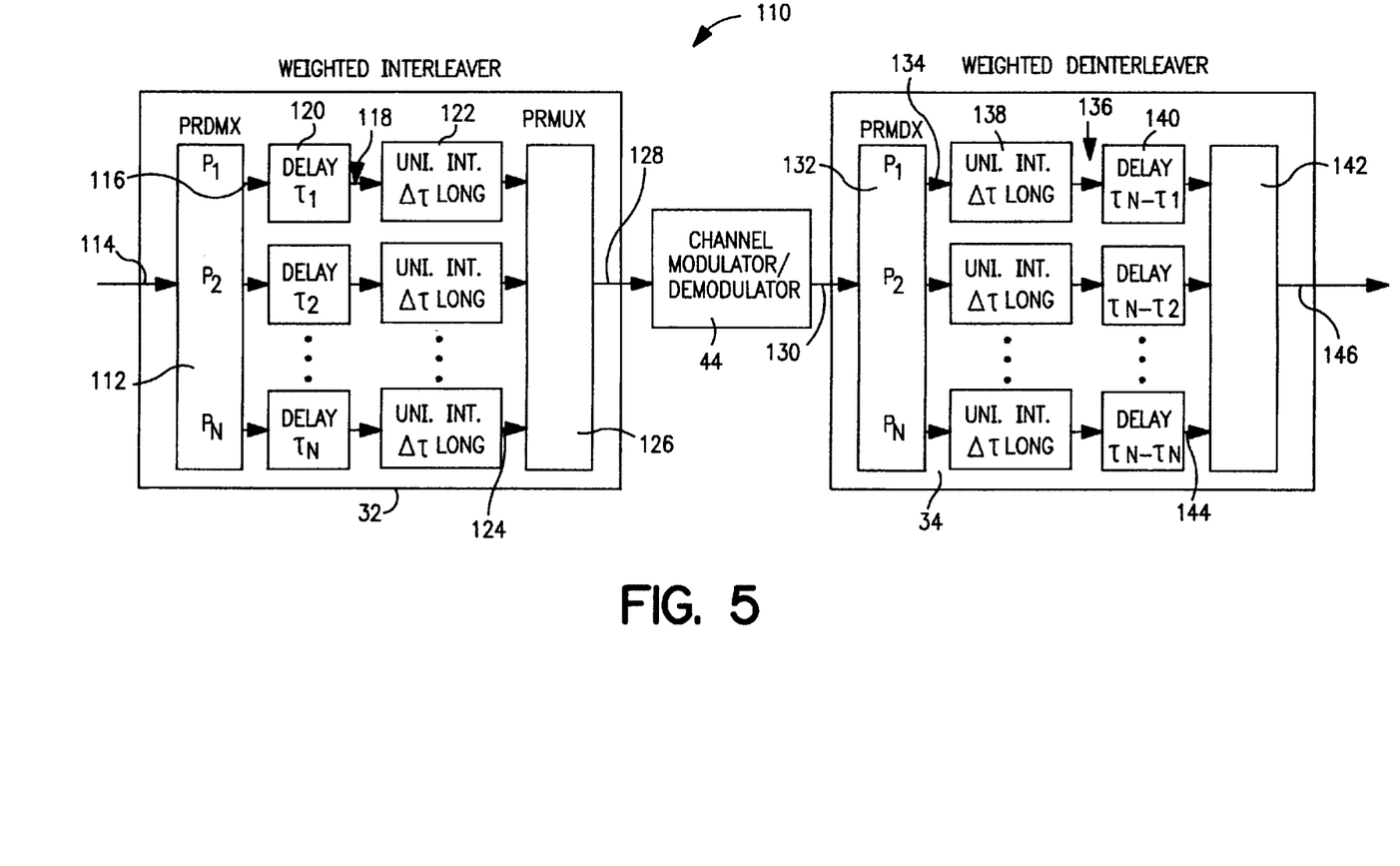
FIG. 5 is a detailed schematic block diagram of another interleaver/deinterleaver modeled from the delay distribution function $\rho(\tau)$ of FIG. 4.

Turning to FIGS. 3–5, the weighted interleaver 32 and the weighted deinterleaver 40, as well as the method for determining the length and shape of the weighted interleaver 32 and the weighted deinterleaver 40 will now be described in detail. Referring specifically to FIG. 3, the weighted interleaver 32 and weighted deinterleaver 40 will be described as a weighted interleaving system 44 with the modulator 34, demodulator 38 and channel 36 simply referred to as a channel modulator/demodulator 46.

The weighted interleaver 32 includes a pseudo-random demultiplexer 48 having an input 50, a first output ($f_E$) 52, a second output ($1-2f_E$) 54 and a third output ($f_E$) 56. The pseudo-random demultiplexer 48 receives input data bits at input 50 and pseudo-randomly distributes the input data bits to the first output 52, the second output 54 and the third output 56. The input data bits are pseudo-randomly or non-uniformly distributed or routed to the three outputs 52, 54 and 56 according to a non-uniform probability distribution. Specifically, the first output 52 will receive on average about 25% of the input data bits, second output 54 will receive about 50% and third output 56 will receive about 25%. In other words, there is a 1:4 probability that input data bits will be distributed or routed to first output 52 and third output 56 and a 1:2 probability that the input data bits will be distributed or routed to second output 54 upon making certain parameter selections, further discussed herein.

In this way, input data bits are received at a first bit rate at input 50 and distributed at outputs 52, 54 and 56, each having a bit rate which is a fraction of the first bit rate. For example, assuming 100 input data bits are received at input 50, on average, output 52 will randomly transfer about 25 of these bits, output 54 will randomly transfer about 50 of these bits and output 56 will randomly transfer about 25 of these bits. Therefore, output 52 may transfer bits 1–10, output 54 may then transfer bits 11–23, output 52 then may transfer bits 24–28, output 56 may then transfer bits 29–34, and so forth until 100 bits are pseudo-randomly or non-uniformly distributed to the outputs with the above-identified non-uniform probability distribution.

The weighted interleaver 32 further includes a first branch 58, a second branch 60, and a third branch 62. The first branch 58 is coupled to or in communication with the first output 52, the second branch 60 is coupled to or in communication with the second output 54, and the third branch 62 is coupled to or in communication with the third output 56. The first branch 58 is essentially a wire which provides substantially no delay of the data bits routed through the first branch 58. The second branch 60 includes a conventional uniform interleaver 64 having a maximum delay or length of $\tau_{max}$. The uniform interleaver 64 may be any conventional uniform interleaver such as a block or convolutional interleaver. Thus, the uniform interleaver 64 will transmit the input data bits routed to it uniform in probability from a minimum delay to a maximum delay (i.e. 0 seconds to $\tau_{max}$) similar to conventional interleavers. An example of such a conventional interleaver is set forth in U.S. Pat. No. 5,483,541, which is hereby incorporated by reference. The third branch 62 includes a maximum delay 66 of $\tau_{max}$ which may be implemented by use of a conventional buffer or shift register. Accordingly, the first branch 58 provides a minimum delay of 0 seconds, the third branch 62 provides a maximum delay 66 of $\tau_{max}$ and the second branch 60 provides a delay distributed uniformly in probability from the minimum delay to the maximum delay (i.e. 0 seconds to $\tau_{max}$) from the uniform interleaver 64.

The interleaved data bits from the first, second third branches 58–62 are then applied to a pseudo-random random multiplexer 68. The pseudo-random multiplexer 68 includes a first input 70, a second input 72, and a third input 74 each coupled or in communication with the first branch 58, the second branch 60 and the third branch 62, respectively. The pseudo-random multiplexer 68 receives the interleaved data bits from the three inputs 70–74 and combines them into a single interleaved data bit stream which is routed out of output 76. The interleaved data bits from output 76 are applied to the channel modulator/demodulator 46 which is the RF channel link 36 between the satellite 14 and the mobile receiver 16. The pseudo-random multiplexer 68 is configured to combine the input data bits it receives at input 70–74 in the same fashion that they are separated at pseudo-random demultiplexer 48. Thus, the pseudo-random demultiplexer 48 and the pseudo-random multiplexer 68 are configured to have the same pseudo-random algorithm. This insures that the single data bit stream at output 76 is interleaved to match the way the input data bit stream is randomly distributed in the demultiplexer 48.

From the channel modulator/demodulator 46, the interleaved data bits are applied to the complimentary weighted deinterleaver 40. The weighted deinterleaver 40 includes a pseudo-random demultiplexer 78 which receives the interleaved data bits at an input 80. The pseudo-random demultiplexer 78 includes a first output 82, a second output 84 and a third output 86. The interleaved data bits received at input 80 are pseudo-randomly distributed or routed out of outputs 82, 84 and 86 in the same fashion as the pseudo-random demultiplexer 48. In other words, the interleaved data bits are distributed or routed out of the pseudo-random demultiplexer 78 in a way that is the same as the way the input data bits are distributed out of the pseudo-random demultiplexer 48.

The weighted deinterleaver 40 also includes a first branch 88, a second branch 90 and a third branch 92, coupled to or in communication with the first output 82, the second output 84 and the third output 86, respectively. The first branch 88, the second branch 90 and the third branch 92 are arranged complimentary or opposite of the first branch 58, the second branch 60 and the third branch 62. This complimentary orientation of the branches enables the interleaved data bits to be reconstructed or lined up in the way the data bits were prior to interleaving in the weighted interleaver 32.

Accordingly, the first branch 88 includes a delay 94 of $\tau_{max}$, the second branch 90 includes a uniform deinterleaver 96 having a length or maximum delay of $\tau_{max}$ (i.e., 0 seconds to $\tau_{max}$) and the third branch 92 has a minimum delay of substantially 0 seconds. The data bits out of branches 88–92 are then applied to a pseudo-random multiplexer 98 at a first input 100, a second input 102 and a third input 104. The pseudo-random multiplexer 98 rearranges the data bits into a deinterleaved data bit stream similar to that received at input 50. This data bit stream is then applied to output 106 of the pseudo-random multiplexer 98. Here again, the pseudo-random multiplexer 98 has the same pseudo-random algorithm as the demultiplexer 48, multiplexer 68 and demultiplexer 78.

The method of determining the shape and length of the weighted interleaving system 44 to generate or construct the weighted interleaver 32 and weighted deinterleaver 40 will now be described. The shape and length of the weighted interleaver 32 and the weighted deinterleaver 40 is matched to the correlation statistics of the channel 36 to provide optimum performance. The decoder 42 coupled to the output 106 of the pseudo-random multiplexer 98 is able to tolerate up to some fraction of its input bits degraded or erased and still provide acceptable performance, measured by its bit error probability. This fraction is called the decoder's erasure threshold. The purpose of an interleaver is to reduce the probability that this erasure threshold is exceeded. If the interleaver has a delay or length $\tau$ and burst or fades occur over some fraction of this length $\tau$, then the expected probability of erasure of any given interleaver output bit will just be this fraction. The decoder's performance is dependent not on the instantaneous probability of a single bit erasure, but instead on the expected probability averaged over its processing time, typically at least several bits.

This average erasure probability will then have a probability of distribution, which is dependent on the channel statistics and the length and shape of the interleaver selected. Minimizing the probability that this average erasure fraction exceeds the decoder's threshold is, to first order, the same as minimizing the width of the erasure fraction distribution. The the width of the erasure fraction distribution is minimized by minimizing the average correlation of erasure over the decoder's averaging time. Thus, the shape of the weighted interleaver 32 is chosen to minimize expected correlation between the weighted deinterleaver's 40 output bits.

Consider a generic interleaver which pseudo-randomly randomly chooses a delay $\tau$ from a distribution $\rho(\tau)$, which implies that the delay selections are independent. If the channel 36 has an impairment (for example, noise burst or a signal fade) with a channel correlation function in time $R(\tau,\tau')$, then the expected correlation between two bits out of a deinterleaver is given by:

$$\langle\rho\rangle=\int\int d\tau d\tau' \rho(\tau') R(\tau,\tau') \quad [1]$$

Minimizing this expected impairment correlation will maximize the probability that the decoder 42 coupled to the weighted deinterleaver 40 will be able to correctly produce valid information bits. Thus, the delay distribution of the weighted interleaving system 44 is derived to yield optimum performance for the specific channel 36.

To practically implement the weighted interleaving system 44 in the communication system 10, it is necessary to constrain either the maximum delay ($\tau_{max}$) or the required amount of memory (M/B) for the weighted interleaving system 44. If the constraint selected is for an interleaver time delay constraint, equation 1 becomes:

$$\langle\rho\rangle = \int_0^{\tau_{max}} \int_0^{\tau_{max}} d\tau d\tau' \rho(\tau)\rho(\tau') R(\tau,\tau') \quad [2]$$

where the interleaver time delay constraint is $\tau_{max}$. With a memory constrained interleaver, equation 1 is minimized with the constraint:

$$\int d\tau\, \tau \cdot \rho(\tau) = \bar{\tau} = \frac{M}{B} \quad [3]$$

where $\bar{\tau}$ is the average delay of the interleaver which is equal to the total memory M of the weighted interleaver 32 in bits divided by the information rate B in bits per second.

Since the weighted interleaving system 44 is incorporated into the communication system 10 operating through a bursty, fading or noise/impairment channel 36, the weighted interleaving system 44 will optimize such a communication link 36. The satellite mobile link to a good approximation is either in clear line-of-sight or blocked and can be described by the known two-state Markov process. The corresponding correlation function of the channel or mobile link 36 is thus given by:

$$R(\tau,\tau')=e^{-|\tau-\tau'|/\overline{T}_{blockage}} \quad [4]$$

where $\overline{T}_{blockage}$ is the mean blockage time. The weighted interleaving system 44 having a maximum delay $\tau_{max}$ minimizes the expected deinterleaver output correlation utilizing a delay distribution function:

$$\rho(\tau) = f_E \delta(\tau) + (1-2f_E)\frac{1}{\tau_{max}}\prod\left(\frac{\tau}{\tau_{max}}\right) + f_E\delta(\tau-\tau_{max}) \quad [5A]$$

where $$\prod(\tau) = \begin{pmatrix} 1 & 0 \leq \tau \geq 1 \\ 0 & \text{otherwise} \end{pmatrix} \quad f_E = \frac{1}{\tau_{max}/\overline{T}_{blockage}+2} \quad [5B]$$

Setting the maximum interleaving delay $\tau_{max}$ to twice the channel correlation time $\overline{T}_{blockage}$, the fraction of input data bits ($f_E$) with a minimum delay of 0 seconds and with a maximum delay of $\tau_{max}$ is one-quarter or 25% (i.e. outputs 22 or 26). This enables the mobile receiver 16 which incorporates the weighted deinterleaver 40 to have an interleaving delay of 0 seconds for one-fourth or 25% of the encoded data bits received by the receiver 16. This information is immediately available for decoding, and the decoder 42 having a moderate fade margin will be able to recover the transmitted information with effectively zero latency, providing increased or faster data acquisition time.

In summary, the method of constructing or generating the weighted interleaving system 44 will include the following steps. First, the expected correlation ($\rho$) between two consecutive data bits out of an interleaver is first provided by equation 1. A channel correlation function in time $R(\tau,\tau')$ is then determined based upon the communication system 10 and channel link 36 utilized. To realize the weighted interleaving system 44, the expected correlation($\rho$) (eq. 1) is constrained by either the maximum delay $\tau_{max}$ of the interleaver or the required memory (M/B) for the interleaver, as set forth in equations 2 and 3. Given the channel correlation function $R(\tau,\tau')$ (eq. 4) and the expected correlation ($\rho$) (e.g., 1) constrained by the maximum delay $\tau_{max}$ (eq. 2), the interleaver delay distribution $\rho(\tau)$ (eqs. 5A and 5B) is solved for to minimize the correlation between two consecutive bits using known calculus of variations to yield equations 5A and 5B.

From equations 5A and 5B, one can generate or construct the weighted interleaver 32. For the satellite-to-mobile channel described by a two-state Markov process, the interleaver delay distribution $\rho(\tau)$ yields three paths consisting of:

$$f_E\delta(\tau) \quad [A]$$

$$(1-2f_E)\frac{1}{\tau_{max}}\prod\left(\frac{\tau}{\tau_{max}}\right) \quad [B]$$

$$f_E\delta(\tau-\tau_{max}) \quad [C]$$

This corresponds to the three branches in the weighted interleaver 32 consisting of branches 58, 60 and 62. Part A identifies a fraction of bits with the minimum delay or delta delay of 0 seconds, corresponding to first branch 58. Part B identifies a fraction of the bits having a uniform probability distribution from the minimum delay to the maximum delay (i.e. 0 seconds to $\tau_{max}$), which corresponds to the second branch 60 and may be implemented by the uniform interleaver 64. Part C identifies a fraction of the bits having a maximum delay (i.e. $\tau_{max}$), corresponding to the third branch 62, which may be implemented with a delay $\tau_{max}$ 66.

Setting the maximum interleaving delay $\tau_{max}$ to twice the channel correlation time $\overline{T}_{blockage}$, a fraction of bits with 0 or maximum delay is one-quarter or 25% by solving for $f_E$ in equation 5B. This provides a probability of distribution of one-quarter for outputs 52 and 56 leaving a probability distribution of one-half or 50% for output 54. Alternatively, should the maximum delay $\tau_{max}$ be set to a different number, as well as the channel correlation time $\overline{T}_{blockage}$, the probability of distribution out of the outputs 52, 54 and 56 may be different.

The delay structure described above is not a general solution for all fading channels. Consequently, the first step in implementing the weighted interleaver is to measure the channel correlation. The next step is to solve equation 1 with the appropriate constraints thereby arriving at a delay distribution $\rho(\tau)$. The following is a technique for implementing an arbitrary interleaver delay distribution using several uniform interleavers. Such a method computes the probability of having a delay in N bins or samples spaced uniformly from $\tau=0$ to $\tau=\tau_{max}$ with:

$$\Delta \tau = \frac{\tau_{max}}{N} \quad [6]$$
$$\tau_i = \Delta \tau \cdot (i-1) \quad i = 1, 2, \cdots, N$$
$$\rho_i = \int_{\tau_i}^{\tau_i + \Delta \tau} d\tau \rho(\tau)$$

where $\Delta \tau$ equals the delay or length of the uniform interleavers utilized, N equals the number of bins or samples taken for the function $\rho(\tau)$, and $\rho_i$ represents the probability of the interleaver delay bits falling between $\tau_i$ and $\tau_i + \Delta \tau$. This approximation of $\rho(\tau)$, thus utilizes piecewise constant steps, as is shown in FIG. 4 to approximate the interleaver delay distribution $\rho(\tau)$.

Each of the steps or rectangles 108 have a uniform delay density over their width, each of which can be realized utilizing a uniform interleaver. The particular shape of $\rho(\tau)$ shown in FIG. 4 is selected based upon the following assumptions. First, assuming that a data bit may be blocked by interference in the mobile communication channel or link 36 such as by a tree, once a data bit is blocked, there is a high probability that a subsequent adjacent data bit will also be blocked since you will still probably be passing by the interfering object. Accordingly, it would be desirable to separate each consecutive bit as far apart as possible thus corresponding to the function $\rho(\tau)$ shown in FIG. 4, where there is a high probability for routing to either the minimum or maximum delays, thereby providing maximum decorrelation between the input data bits. Should other environments be known such as when the vehicle 24 travels down a path with adjacent interferences occurring uniformly, such as with-telephone poles, it may be desirable to shape the function $\rho(\tau)$ as a sinusoidal function. It should further be noted that the N samples could be increased to better approximate the function $\rho(\tau)$ and the spacing of the samples by $\Delta \tau$ also does not require them to be uniform.

From the above, a different weighted interleaving system 110 can be constructed as shown in FIG. 5, for use in the communication system 10. Here again, the weighted interleaving system 110 includes the weighted interleaver 32 in communication with the weighted deinterleaver 40, via the channel modulator/demodulator 46. The weighted interleaver 32 includes a pseudo-random demultiplexer 112 having an input 114 to receive input data bits. The pseudo-random demultiplexer 112 randomly distributes or routes the input data bits received at input 114 to N number of outputs 116 with a probability distribution $\rho_i$. For example, assuming there are eight outputs 116 with eight steps or rectangles 108, as shown in FIG. 4, $\rho_1$ and $\rho_8$ will have a higher probability of receiving more input data bits versus $\rho_4$ and $\rho_5$, based upon the area of the rectangles 108. Moreover, it should be noted that with this example, the encoder 30 will preferably be a rate ⅛ encoder 30 thereby matching the rate with the number of paths in the interleaver 32.

Each N output 116 is coupled to or in communication with a branch 118. Each branch 118 includes a delay $\tau_N$ 120 and a uniform interleaver 122 having a length or delay of $\Delta \tau$. With N equal to eight, and $\Delta \tau$ being uniform or equal to one, $\tau_{max}$ also equals eight. Thus, delay $\tau_1$ will be a delay of zero seconds while $\tau_2$ will be a delay of one second and so forth and each uniform interleaver will have a length or delay of $\Delta \tau$ or one second. The data bits from each branch 118 are then applied to N inputs 124 of pseudo-random multiplexer 126. The pseudo-random multiplexer 126 combines the delayed input data bits in the same fashion as the pseudo-random demultiplexer 112 separates the input data bits and applies the combined interleaved input data bits to an output 128 through the channel modulator/demodulator 46.

From the channel modulator/demodulator 46, the interleaved data bits are applied to an input 130 of a pseudo-random demultiplexer 132 in the weighted deinterleaver 40. The pseudo-random demultiplexer 132 separates the interleaved data bit stream following the same pseudo-random pattern as the pseudo-random demultiplexer 112 and applies these to N outputs 134. Each output 134 is in communication with a complimentary branch 136, each having a uniform interleaver 138, with a length or delay $\Delta \tau$ and a delay 140 with a delay opposite the delay in the weighted interleaver 32 (i.e., $\tau_N - \tau_1$, . . . ). The complimentary branches 136 having opposite delays deinterleaves the interleaved data bit stream from input 130 which are applied to a pseudo-random multiplexer 142 having N inputs 144. The pseudo-random multiplexer 142 also combines the data bits in the same fashion that the pseudo-random demultiplexer 112 separates the data bits such that a deinterleaved data bit stream is then applied to an output 146 of the pseudo-random multiplexer 142 which would subsequently be applied to the decoder 42.

Figure 6:
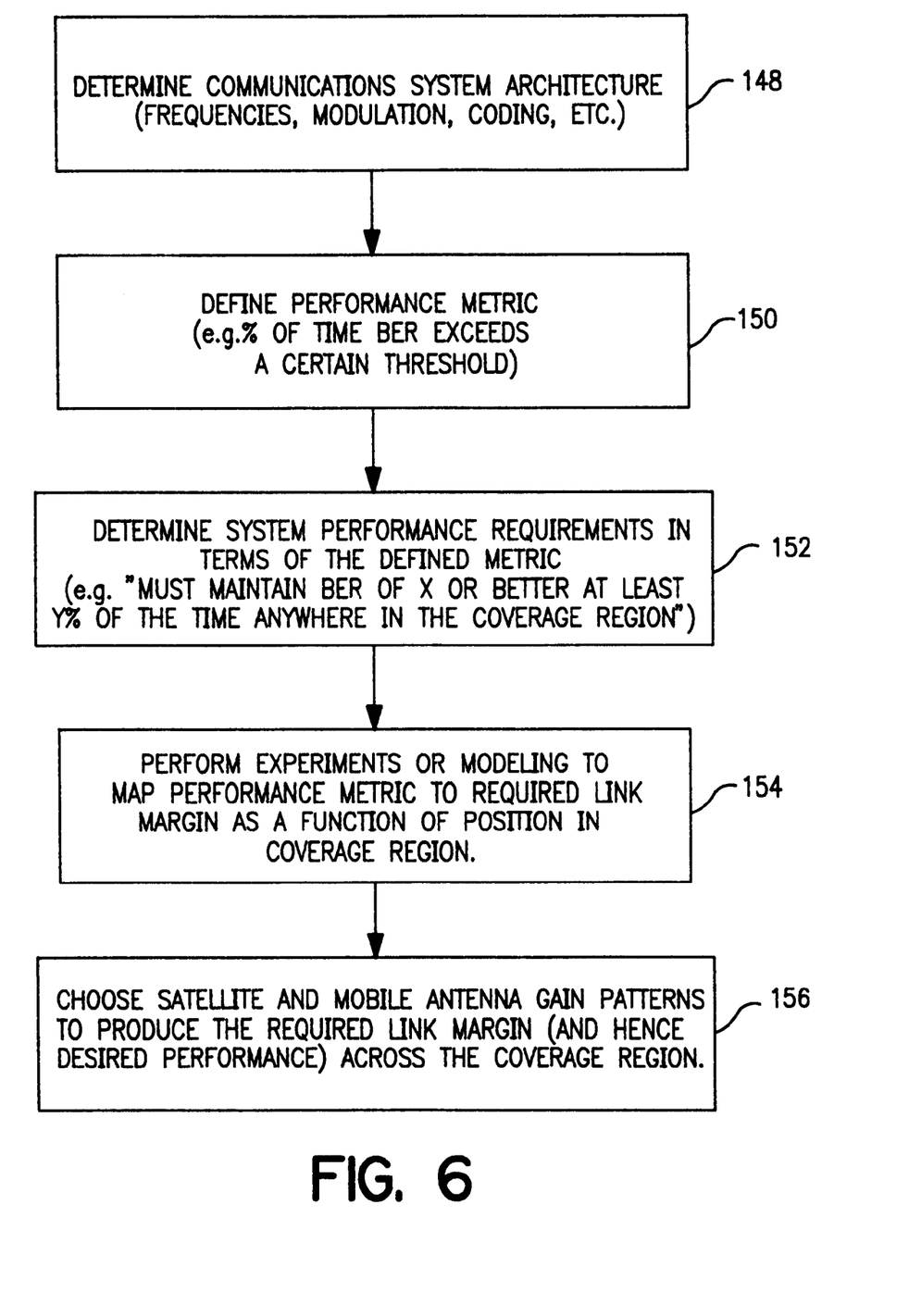
FIG. 6 is a flow chart setting forth the steps for determining the weighted link margins of FIG. 2.

Turning to FIG. 6, a flowchart depicting the method for intentionally weighting the system link margins across the coverage area or region 18 to counteract the regional variations in the propagation environment is disclosed. First, at block 148, a determination or selection is made as to the communication system 10 architecture. This determination or selection includes determining the operating frequency, type of modulation, type of coding, etc. From block 148, the method proceeds to step 2 at block 150. Here, a performance metric (i.e. quantify performance) is determined based upon a selected performance parameter. For example, the parameter selected could include monitoring the percent of time the bit error rate (BER) exceeds a specified threshold. Once the performance metric is defined, the method proceeds to step 3 or block 152.

At block 152, a determination is made as to the system performance requirements in terms of the defined metric of block 150. In other words, a bit error rate (BER) of X or better must be maintained at least Y percent of the time anywhere in the coverage region 18. Once the performance requirement is determined, the method proceeds to step 4 at block 154. At block 154, modeling or performance experiments to map the performance metric to determine required link margins as a function of position in the coverage region 18 is performed. In other words, one will either take actual bit error rate measurements over time throughout different regions within the coverage area 18 to determine in dBs the link margin required to have a substantially uniform value of Y over the entire coverage region 18. Alternatively, modelling can be performed versus taking actual bit error rate (BER) measurements based upon the various locations of the coverage regions and the respective elevation angles to the satellite in the various locations in the coverage region 18.

Once the required link margins as a function of position are determined at block 154, the method proceeds to step 5 at block 156. At block 156, satellite and mobile antenna patterns are selected to produce the required link margins (enhance the desired performance) across the entire coverage region 18 using known antenna gain techniques. In the satellite 14, one means of creating the shaped antenna pattern would be through the use of a slotted waveguide array antenna 20 which is light weight and adaptable to a wide range of coverage patterns. For the mobile antenna 22, a quadrifilar helix antenna would be an effective technique for providing 360° azimuth coverage while concentrating gain in the desired range of elevation angles.

Figure 7:
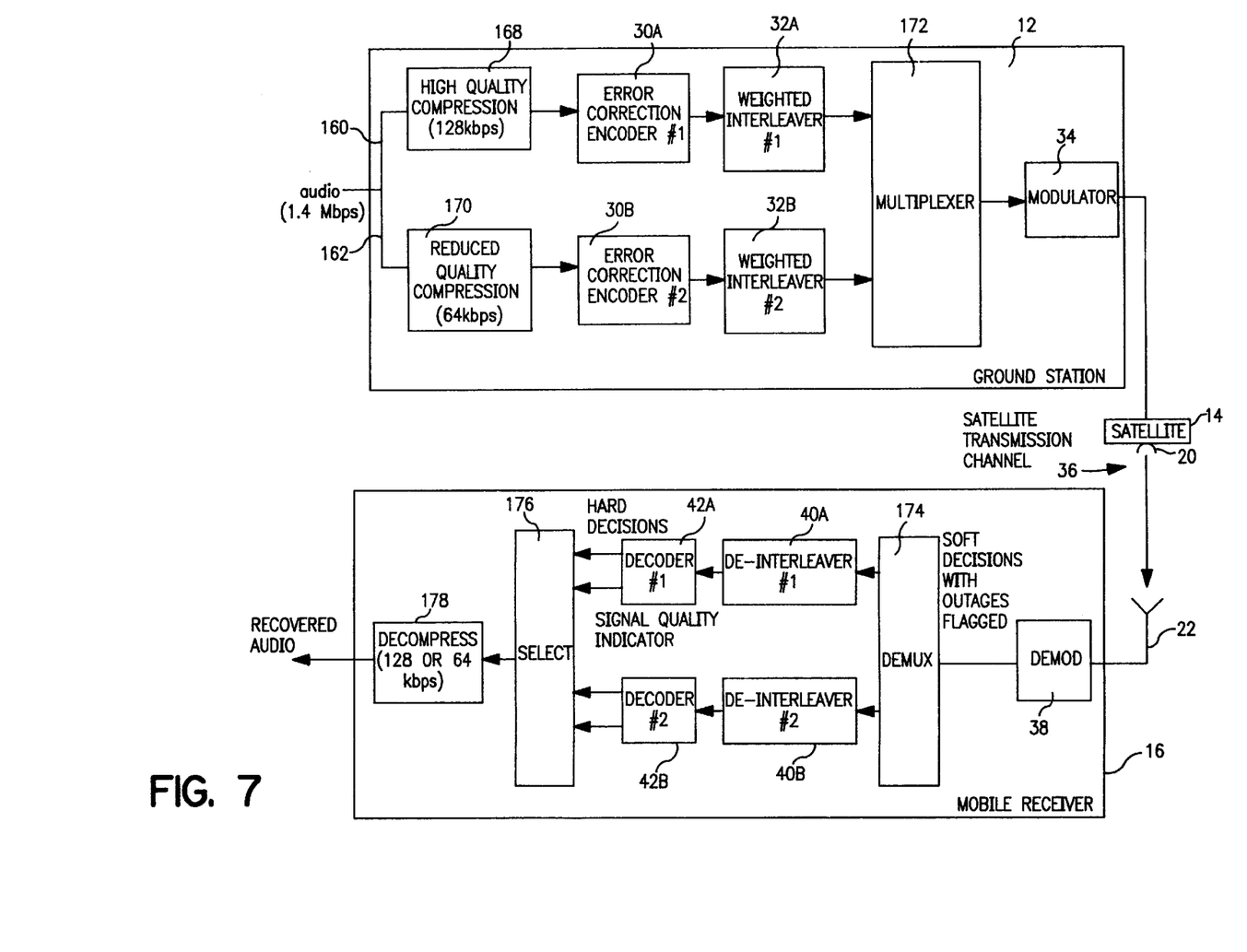
FIG. 7 is a detailed schematic block diagram of a second preferred embodiment of the present invention.

Referring now to FIG. 7, a detailed schematic block diagram of a second preferred embodiment of a communication system 158 is disclosed. In this regard, like reference numerals will be used to identify similar structures. The communication system 158 includes the ground station 12, in communication with the satellite 14 which rebroadcasts communication signals, via the antenna 20, to the mobile receiver 16, which receives the information, via its antenna 22. The ground station 12 includes a first signal path 160 and a second signal path 162 and the mobile receiver 16 includes a first signal path 164 and a second signal path 166. Additional signal paths may also be employed. In the ground station 12, data bits such as audio data bits having .a data bit rate of about 1.4 megabits per second (Mbps) are simultaneously sent along both signal paths 160 and 162.

At path 160, the audio data bits are applied to a high quality compression algorithm 168 to compress the digital audio data bits down to a rate of 128 kilobits per second (Kbps). The high quality compression algorithm 168 essentially takes the audio data bits and compresses the bits by removing data bits directed to frequencies in which the human ear cannot hear, thereby removing extraneous information to compress and reduce the data bit rate. At path 162, the non-compressed audio data bits are applied to a reduced quality compression algorithm 170 which compresses the data bits even further down to a rate of 64 Kbps, thereby providing not as high a quality of audio recognition. The compression algorithms 168 and 170 can be any conventional audio compression algorithms such as those supplied by AT&T and Dolby.

From the high quality compression 168, the compressed data bits are applied to the error correction encoder 30A and the weighted interleaver 32A. From the reduced quality compression algorithm 170, the further compressed data bits are applied to the error correction encoder 30B and weighted interleaver 32B. This provides dual paths for simultaneously interleaving the data bit streams, via weighted interleavers 32A and 32B. Both of the weighted interleavers 32A and 32B are matched to the channel correlation function, as discussed above, but each preferably have different lengths or maximum delays without any overlapping delay. Thus, each interleaver 32A and 32B are only constrained differently by the length $\tau_{max}$. The first interleaver 32A will have a non-uniform random delay between a first minimum delay and a first maximum delay and the second interleaver 32B will have a non-uniform random delay between a second minimum delay and a second maximum delay. Each encoder 30A and 30B also has a different encoder rate (i.e. a first encoder rate and a second encoder rate) based upon the data bit rates being applied to the encoders (i.e. 128 Kbps or 64 Kbps).

The longer the interleaver delay, the more memory required by an interleaver and thus if there is a lower data bit rate, you can have a longer interleaver length with the same amount of memory compared to an interleaver operating at a higher bit rate. For example, assuming that you have 4 MB of total memory between both interleavers 32A and 32B (i.e. 2 MB/each), 2 MB may provide an average delay $\tau_{max}$ of about 15.625 seconds at 128 Kbps, and 2 MB may provide an average delay $\tau_{max}$ of about 31.25 seconds at 64 Kbps. Therefore, the first path 160 will generally provide a shorter interleaver length since it has a higher data rate, while providing a fast acquisition time. The second path 162 will generally provide a more robust signal which has a slower data bit rate but a higher interleaving time or delay. This enables the second path 162 to transmit lesser quality data but with a more robust signal which utilizes less resources such as less power and bandwidth, while still providing the benefit of a secondary path should the data from the first path 160 be subsequently lost at channel link 36.

From the weighted interleavers 32A and 32B, the data bits are applied to a multiplexer 172 to combine the separate signals onto a single output using time multiplexing under TDMA techniques. Other multiplexing techniques such as CDMA or FDMA could also be utilized. From the multiplexer 172, a signal is applied to the modulator 34 to modulate the data onto a carrier signal which is subsequently broadcast by the satellite 14, via antenna 20.

The demodulator 38 in the mobile receiver 16 receives the communication signal, via the antenna 22 and strips the carrier signal from the data to apply the data bits, some which may be flagged to identify transmission outages to a demultiplexer 174. The demultiplexer 174 demultiplexes the data bits to separate the data bits along two corresponding paths comprised of the deinterleavers 40A and 40B and the decoders 42A and 42B. The high quality data bits from path 164 and the reduced quality data bits from path 166 are both applied to a selector 176 which may be either implemented in hardware or by use of software and a microprocessor.

The selector 176 determines which data bits from which path to use based on a signal quality indicator received from each decoder 42A and 42B. Each decoder 42A and 42B will know how hard the decoder is operating based on its bit error rate estimate which can be used as a signal quality indicator and passed to the selector 176. The selector 176 will normally want to use the high quality data bits from path 164. However, if the bit error rate from the path 164 is not acceptable (i.e. if BER is greater than a set threshold), it is not desirable to use the high quality data bits from path 164. The selector 176 then checks the bit error rate from the path 166 from the reduced quality data bits to determine if the bit error rate is above the set threshold. If the bit error rate is below this threshold or acceptable, the selector 176 will then select the reduced quality data bits from path 166.

The selected data bits are then applied to a decompression algorithm 178 which can operate at both data bit rates of 128

Kbps or 64 Kbps. The decompression algorithm 178 will select either rate depending on the information provided in the header from the packets of information routed by the selector 176. Once the decompression algorithm 178 is applied to the selected data bits, the audio data bits are then recovered. The communication system 158 thus provides a system which is more robust to bursty or fading channels by utilizing a dual path in both the ground station 12 and the mobile receiver 16 without requiring significantly more power or bandwidth based upon the complimentary selections of the encoders 30A and 30B and the interleavers 32A and 32B.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A method for broadcasting over a channel to users in a coverage region, said method comprising the steps of:

selecting a communication system architecture;

defining a performance metric based upon the communication system architecture selected;

determining communication system performance requirements based upon the defined performance metric;

mapping the performance metric as a function of position in the coverage region to determine required weighted link margins across the coverage region;

selecting antenna gain patterns of a transmit and a receive antenna to generate the required link margins; and transmitting a signal from the transmit antenna to the receive antenna in the coverage region based upon the required link margins.

2. The method as defined in claim 1 further comprising expanding data bits from a signal in an error correction encoder and interleaving said expanded data bits by a delay distribution non-uniform in probability between a minimum delay and a maximum delay in a weighted interleaver.

3. A method for broadcasting over a channel to users in a coverage region, said method comprising the steps of receiving data bits at a first input of an error correction encoder;

expanding each data bit received at the first input by an encoder rate;

receiving the expanded data bits at the second input to a weighted interleaver;

interleaving the expanded data bits by a non-uniform delay distribution between a minimum delay and a maximum delay; and transmitting the expanded and interleaved data bits over the channel.

4. The method as defined in claim 3 further comprising the step of deinterleaving and decoding tee expanded and interleaved data bits in a receiver having a complimentary weighted de-interleaver and decoder.

5. The method as defined in claim 4 further comprising the steps of:

transmitting signals in the coverage region to a receive antenna in the receiver; and weighting link margins across the coverage region to counteract regional variations in the propagation environment in the coverage region.

6. The method as defined in claim 4 further comprising the step of detecting channel fade conditions in a demodulator in the receiver and nulling a received signal if a channel fade condition is detected.

7. The method as defined in claim 6 further comprising the step of flagging a received signal if a channel fade condition is detected.

8. The method as defined in claim 3 further comprising the step of applying the data bits received by the error correction encoder to a compression algorithm prior to being received by the error correction encoder.

9. A method for broadcasting over a channel to users in a coverage region, said method comprising the steps of:

providing a transmitter having a first signal path operable to route first data bits and a second signal path operable to mute second data bits;

expanding each first data bit by a first encoder rate;

expanding each second data bit by a second encoder rate;

interleaving the expanded first data bits by a delay distribution between a first minimum delay and a first maximum delay;

interleaving the expanded second data bits by a delay distribution between a second minimum delay and a second maximum delay; and transmitting the expand and intereaved first and second data bits over the channel.

10. The method as defined in claim 9 further comprising the steps of:

compressing the first data bits by a first compression algorithm; and compressing the second data bits by a second compression algorithm.

11. The method as defined in claim 10 further comprising detecting channel fade conditions in a demodulator in the receiver and nulling a received signal if a channel fade condition is detected.

12. The method as defined in claim 9 further comprising the steps of:

transmitting communication signals in the coverage region to a receive antenna in a receiver; and weighting link margins across the coverage region to counteract regional variations in the propagation environment in the coverage region.

13. The method as defined in claim 12 further comprising the steps of:

flagging a received signal if a channel fade condition is detected.

* * * * *